United States Patent

Harris

(10) Patent No.: US 8,006,950 B2
(45) Date of Patent: Aug. 30, 2011

(54) APPARATUS SUPPORT

(75) Inventor: Paul George Harris, Haverhill (GB)

(73) Assignee: Vistec Lithography Inc., Watervliet, NY (US)

( * ) Notice: Subject to any disclaimer, the term of this patent is extended or adjusted under 35 U.S.C. 154(b) by 224 days.

(21) Appl. No.: 12/522,860

(22) PCT Filed: Jan. 8, 2008

(86) PCT No.: PCT/GB2008/000032
§ 371 (c)(1),
(2), (4) Date: Jul. 10, 2009

(87) PCT Pub. No.: WO2008/084202
PCT Pub. Date: Jul. 17, 2008

(65) Prior Publication Data
US 2010/0102196 A1    Apr. 29, 2010

(30) Foreign Application Priority Data

Jan. 10, 2007   (GB) .................................. 0700467.4

(51) Int. Cl.
*F16M 11/00* (2006.01)
(52) U.S. Cl. ........................ 248/638; 248/636
(58) Field of Classification Search .................. 248/638, 248/676, 678, 686, 636, 127, 277; 267/141.4
See application file for complete search history.

(56) References Cited

U.S. PATENT DOCUMENTS

| 2,538,658 | A | 1/1951 | Saurer |
| 5,121,905 | A | 6/1992 | Mann et al. |
| 5,884,893 | A | 3/1999 | Seki et al. |
| 2003/0071187 | A1* | 4/2003 | Herren et al. ................. 248/638 |
| 2008/0149806 | A1* | 6/2008 | Yoon ............................. 248/638 |
| 2010/0320360 | A1* | 12/2010 | McLeod ........................ 248/678 |

FOREIGN PATENT DOCUMENTS

| GB | 506801 A | 6/1939 |
| GB | 2 034 487 A | 6/1980 |
| GB | 2 216 984 A | 10/1989 |
| GB | 2 273 328 A | 6/1994 |

* cited by examiner

*Primary Examiner* — Ramon O Ramirez
(74) *Attorney, Agent, or Firm* — Sughrue Mion, PLLC

(57) ABSTRACT

An apparatus support (11) with a damping characteristic comprises a rigid reinforcing component, in particular a steel plate (19), encapsulated by a body (16) of compliant material, particularly a composite of particulate mineral material and synthetic binder. The plate (19) defines an opening (19*a*) at spacing from the upper side of the body (16) and a mounting ring (21) is embedded in the body so as to be disposed at least partly above the opening. The ring (21) has a peripheral flange (21*a*) which is spaced from the plate (19) and from the upper side of the body and overlaps the plate in vertical projection. Material of the body is thus disposed above the flange (21*a*) and also sandwiched between the flange and the plate so that a damping zone is present around the ring both above and below the flange.

17 Claims, 2 Drawing Sheets

APPARATUS SUPPORT

The present invention relates to an apparatus support with a damping characteristic, especially a support suitable for supporting displacement-sensitive machines, tools and instruments susceptible to vibration.

Supports for apparatus take many forms and usually are adapted to the requirements and characteristics of the individual apparatus, for example weight, size, robustness, sensitivity to vibration and other factors. Special demands are imposed on supports by machines, tools and instruments which are sensitive to vibration, yet have to be securely and rigidly supported. It is then highly desirable to utilise a support with a damping characteristic, but the problem then arises that vibration of apparatus supported on the support can, due to the compliance of the material providing the damping, persist for a relatively extended period of time. This problem is particularly troublesome in the case of equipment operating with high levels of accuracy and high throughput rates, for example an electron beam lithography machine with a supported electron beam column, since operation is disrupted by the settle periods required for vibration to reduce to the point of restoration of a sufficiently quiescent state of the equipment. These extended settle periods, represented in the case of an electron beam column by a vibration dying out slowly due to Coulomb friction, can have a significant detrimental effect on writing speed and thus throughput.

It is therefore the principal object of the invention to achieve an improvement in the means for supporting apparatus so that damping of vibration may be more effective or, at least, less susceptible to prolonged settle periods.

Other objects and advantages of the invention will be apparent from the following description.

According to the present invention there is provided an apparatus support with a damping characteristic, comprising a rigid reinforcing component encapsulated by a body of compliant material, the component defining an opening at a spacing from an intended upper side of the body, and a mount for apparatus, the mount being embedded in the body to be disposed at least partly above the opening and having a flange which is spaced from the component and from the upper side of the body and overlaps the component in vertical projection thereof so that material of the body is disposed above the flange and is sandwiched between the flange and the component to provide a damping zone around the mount both above and below the flange.

An apparatus support constructed in this manner with the flange of the mount vertically overlapping the component and damping zones—provided by the compliant material of the encapsulating body—above and below the flange results in a 'gimbal' effect in which the mount is quasi floating in a highly viscous body and the compliant material on the two sides of the flange is loaded in tension and in compression in alternation in the event of vibration of apparatus mounted on the mount, the damping zones being stabilised by the underlying component. A four-ply location of the mount with alternate plies of compliant and rigid material is thus provided, as a consequence of which the vibration mode of the apparatus is such that the amplitude of vibration rapidly diminishes. The apparatus can therefore attain a quiescent state relatively quickly so that operation of the apparatus, insofar as that operation may be disrupted by vibration, can be resumed without undue delay.

The mount is preferably accessible at the upper side of the body, thus exposed, so that apparatus can be directly supported by and rigidly fixed to the mount. In that case, an upper side of the mount can be substantially flush with the upper side of the body so as to provide a smooth transition, at the top of the support, from the mount to the surrounding material of the body.

Depending on the respective requirements, the mount can be constructed with a lower portion thereof extending in the component opening, so that, for example, a part or subsystem of the apparatus can be fixed to the mount below the reinforcing component. The flange is preferably disposed between and at a spacing from upper and lower sides of the mount, as a result of which it defines an intermediate collar and the mount as a whole can be conveniently formed integrally by machining a billet or a casting.

The mount itself can define an opening substantially aligned with the component opening, so that a physical element or non-physical output of apparatus supported on the support—for example the beam of an electron beam column—can pass through the openings to a work area thereunder. The openings can in that case be, for example, circular and coaxial and the mount is preferably annular.

Anchorage of the mount in the body can be strengthened if the mount has openings or recesses filled with the body material, such openings or recesses conveniently being located in the flange. Penetration of the body material into the openings or recesses in conjunction with sandwiching of the flange imparts to the mount a high level of resistance to any tendency to loosen or dislodge in the case of loads, up to and beyond an anticipated normal level, acting on apparatus mounted on the mount.

The reinforcing component is, in a preferred embodiment, part of a frame wholly enclosed by the body of compliant material, for example an apertured plate at the top of the frame. The component is preferably of metallic material and the compliant material preferably a solidified composite casting material, which can, for example, be filled in a liquid state into a mould so as to encapsulate the component and, in the course of filling the mould, penetrate into the mentioned openings or recesses optionally provided in the flange. More specifically, the compliant material can be based on a particulate mineral or metallic material, such as granite, and a synthetic resin, such as epoxy resin. A material of this composition combines a high level of strength with the desired capability of imparting a damping characteristic to the support.

The invention also embraces, in a further aspect, equipment comprising a support and apparatus mounted on the mount, for example an electron beam lithography machine with an electron beam column carried by the mount.

An embodiment of the present invention will now be more particularly described by way of example with reference to the accompanying drawings, in which.

Figure 1:
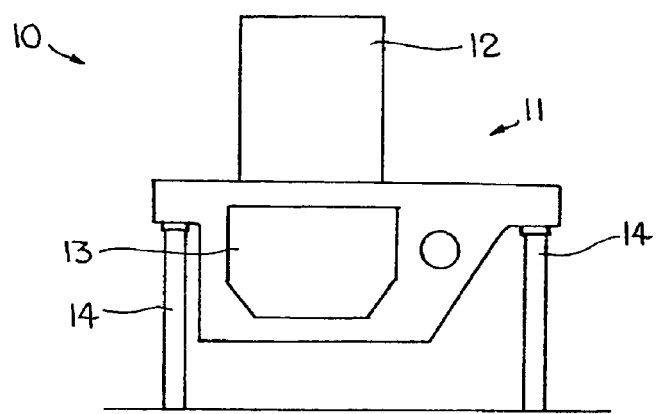
FIG. 1 is a schematic side elevation of equipment incorporating an apparatus support embodying the invention, showing apparatus supported on the support.
Figure 2:
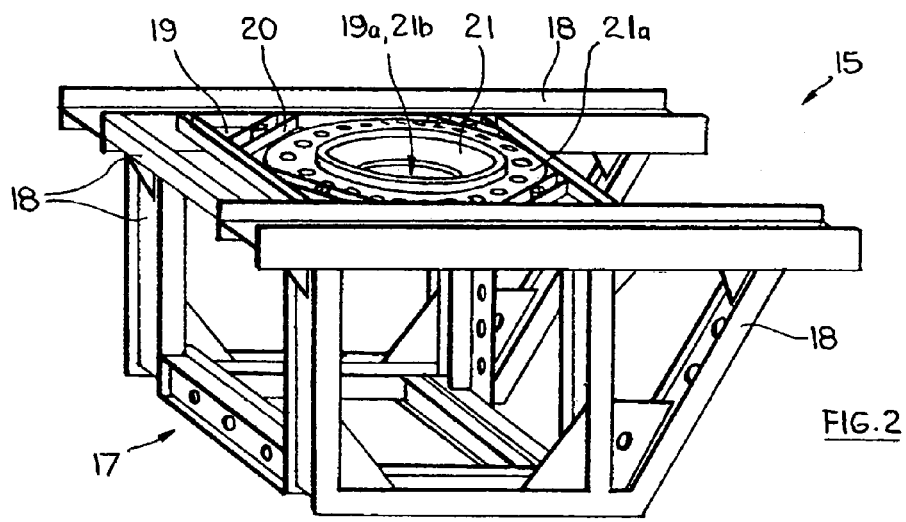
FIG. 2 is a schematic perspective view, to an enlarged scale, of an internal frame and a mounting ring—by themselves—of the support shown in FIG. 1.

Referring now to the drawings there is schematically illustrated in FIG. 1 equipment 10 incorporating an apparatus support 11 embodying the invention. The equipment in this instance is, by way of convenient example, an electron beam lithography machine. Apparatus in the form of an electron beam column 12 is supported on the support 11 and subsystems, including a vacuum chamber casing 13 containing an X-Y stage for movably carrying a substrate on which pattern writing is to be carried out by an electron beam generated by the column 12, are located in an interior cavity of the support 11. The support 11 is supported relative to the ground by vibration/shock insulating posts 14. The support 11 not only has to bear substantial loads represented by the weight of the column 12, casing 13 and other systems, but also has to resist any tendency to crack, fracture, deflect or deform (including expansion and contraction) and suppress transmission, or at least damp, vibration and other movements emanating from individual components of the equipment, especially from reaction forces to the stage movement Electron beam lithography machines operate to particularly close tolerances, often in the nanometer range, and even the slightest departure from a completely quiescent state can lead to operating inaccuracies, notably errors in writing. Consequently, the column should ideally be supported by a support combining the requisite rigidity with a damping characteristic, particularly a characteristic which in the case of vibration of the column causes the vibration to reduce to a low amplitude relatively quickly so as to enable return to the quiescent state within a minimum settle period.

Figure 3:
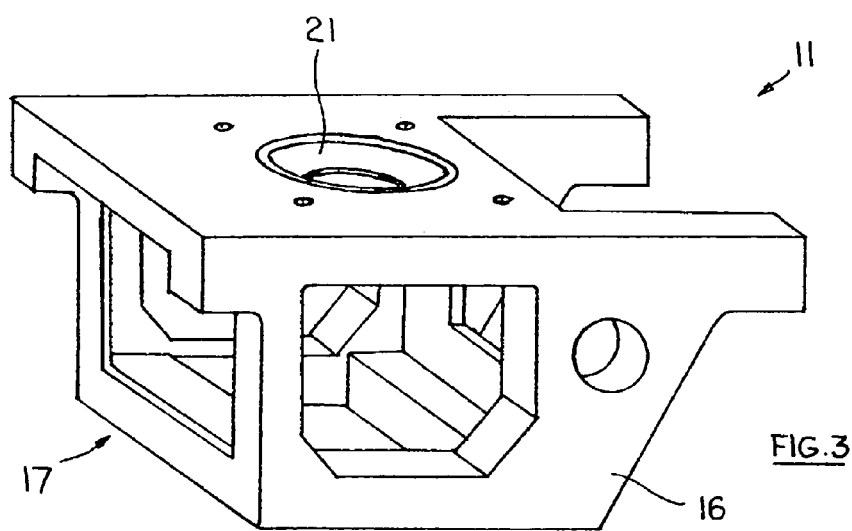
FIG. 3 is a view corresponding with FIG. 2, but of the complete support.

This is achieved in part by construction of the support 11, in the case of the described embodiment from a frame 15 of metallic material, especially steel, as shown in FIG. 1, encapsulated in a cladding 16 formed by a solidified composite casting material, preferably granite particles of several grades incorporated in an epoxy resin binder, as shown in FIG. 3. The frame basically comprises a rigid box-like structure 17 bounding a cavity for reception of the casing 13 (FIG. 1) and formed by welded-together profile-section rails 18 braced where appropriate by steel plate gussets. The frame 15 has at the top a reinforcing component in the form of a steel plate 19 with a central circular opening 19a. The plate 19 effectively closes—apart from its opening 19a—the top side of the structure 17 and is securely welded to the adjacent rails of the structure 17 as well as braced across the corners by welded channel-section members 20. The box-like structure 17 of profile-section rails with gusset bracing, including the plate 19, results in a particularly rigid construction resistant to loading in bending, tension and compression and able to accept the weight of the column 12, casing 13 and other components of the equipment substantially without risk of deformation or deflection. The encapsulating cladding 16, on the other hand, imparts the desired damping characteristic by virtue of its composition from an inherently compliant material.

Figure 4:
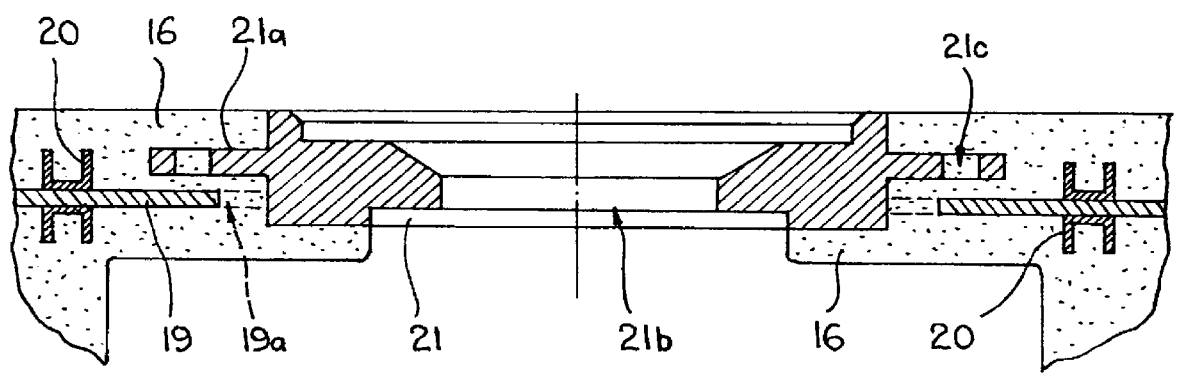
FIG. 4 is a schematic sectional view of part of the support in the region of the mounting region.

Support of the column 12 is by way of a mounting ring 21 of metallic material, preferably steel, embedded in the material of the cladding 16 in such a manner as to provide rapid reduction in the amplitude of vibration of the mounted column. For this purpose and as best shown in FIG. 4 the ring 21, which can be machined from a steel billet or casting, has intermediate its upper and lower ends a circumferential flange 21a disposed at a spacing from the plate 19 and also from the top side of the cladding 16. The flange 21a, however, overlaps the plate 19 in vertical projection so that the compliant material of the cladding 16 is located above, below and circumferentially of the flange, whereby damping zones are formed above and below the flange and the ring 21 as a whole effectively floats in the compliant material. The ring 21 is positioned with its opening 21b coaxial with the opening 19a of the plate 19, so that a lower end section of the column 12 can extend through to the vicinity of the stage 13, and with its top face exposed at the top surface of the cladding, so as to facilitate mounting of the column.

Construction of the support 11 can be carried out by locating the frame 15 and ring 21 in the desired relationship within a mould, which follows the outline of the frame at small spacing therefrom and which is filled with the composite cladding material in liquid state. On hardening of the material, a body thereof encapsulating the frame 15 and the ring 21, apart from the exposed top face of the ring, is formed. Anchorage of the ring 21 in the cladding 16 can be enhanced by provision of openings 21c in the flange 21a, the cladding material in liquid state penetrating the openings 21c during filling of the mould.

In use of the lithography equipment incorporating the support 11 it is possible for disturbing vibration to be transmitted through the support to the column 12, for example due to reaction forces following stage displacement. By virtue of the quasi floating location of the ring 21 with its flange 21a sandwiched between layers of the compliant material, alternate tension and compression of the material in these layers during rocking of the column leads to rapid reduction in the amplitude of column oscillation. The ring 21, as an integral part of a layered system with plies of alternately different material, i.e. the sequence of damping material, steel flange 21a, damping material again and steel plate 19, tends to maintain its predetermined location as if gimbal-mounted free of positional influence by the surrounding rocking body. The settle period for the column is thus significantly reduced by comparison with prior art support arrangements and pattern writing on the substrate can be more quickly resumed after each stage displacement, thereby increasing throughput.

Although the foregoing embodiment has been described in conjunction with an electron beam lithography machine the apparatus support can be constructed in various ways depending on the respective requirements, with or without incorporation of the reinforcing component in a frame, and is usable for supporting a wide range of apparatus, but particularly movement-sensitive instruments and tools.

The invention claimed is:

1. An apparatus support with a damping characteristic, comprising a rigid reinforcing component encapsulated by a body of compliant material, the component defining an opening at a spacing from an intended upper side of the body, and a mount for apparatus, the mount being embedded in the body to be disposed at least partly above the opening and having a flange which is spaced from the component and from the upper side of the body and overlaps the component in vertical projection thereof so that material of the body is disposed above the flange and is sandwiched between the flange and the component to provide a damping zone around the mount both above and below the flange.

2. A support as claimed in claim 1, wherein the mount is accessible at the upper side of the body.

3. A support as claimed in claim 1, wherein an upper side of the mount is substantially flush with the upper side of the body.

4. A support as claimed in claim 1, wherein a lower portion of the mount extends in the component opening.

5. A support as claimed in claim 1, wherein the flange is disposed between and at a spacing from upper and lower sides of the mount.

6. A support as claimed in claim 1, wherein the mount defines an opening substantially aligned with the component opening.

7. A support as claimed in claim 6, wherein the component opening and mount opening are circular and coaxial.

8. A support as claimed in claim 1, wherein the mount is annular.

9. A support as claimed in claim 1, wherein the mount has openings or recesses filled with the body material.

10. A support as claimed in claim 9, wherein the openings or recesses are provided in the flange.

11. A support as claimed in claim 1, wherein the component is part of a frame wholly enclosed by the body.

12. A support as claimed in claim 1, wherein the component is of metallic material.

13. A support as claimed in claim 1, wherein the compliant material is a solidified composite casting material.

14. A support as claimed in claim 1, wherein the compliant material is based on a particulate mineral or metallic material and a synthetic binder.

15. A support as claimed in claim 14, wherein the particulate mineral material is granite and the binder is epoxy resin.

16. An apparatus support with a damping characteristic for supporting an apparatus which, when combined with the support comprise an equipment, comprising a rigid reinforcing component encapsulated by a body of compliant material, the component defining an opening at a spacing from an intended upper side of the body, and a mount mounting the apparatus, the mount being embedded in the body to be disposed at least partly above the opening and having a flange which is spaced from the component and from the upper side of the body and overlaps the component in vertical projection thereof so that material of the body is disposed above the flange and is sandwiched between the flange and the component to provide a damping zone around the mount both above and below the flange.

17. The apparatus support as claimed in claim 16, wherein the equipment is an electron beam lithography machine and the apparatus comprises an electron beam column.

\* \* \* \* \*